United States Patent [19]

Tsunashima

[11] 4,323,593
[45] Apr. 6, 1982

[54] METHOD OF PRINTING A SPOT PATTERN IN A PRINTED CIRCUIT BOARD

[75] Inventor: Eiichi Tsunashima, Hirakata, Japan

[73] Assignee: Matsushita Electric Industrial Co., Ltd., Kadoma, Japan

[21] Appl. No.: 139,213

[22] Filed: Apr. 11, 1980

[30] Foreign Application Priority Data

Apr. 11, 1979 [JP] Japan .................................. 54-44710

[51] Int. Cl.³ ............................................. H05K 3/40
[52] U.S. Cl. ..................................... 427/97; 427/282; 118/504; 29/852
[58] Field of Search ........................... 427/96, 97, 282; 118/504, 505; 101/128.21, 129, 127; 29/852, 853, 885

[56] References Cited

U.S. PATENT DOCUMENTS 3,948,706  4/1976  Schmeckenbecher .......... 427/287 X
4,024,629  5/1977  Lemoine et al. .................. 427/97 X

OTHER PUBLICATIONS

Brady et al., "Screening Mask for Depositing Large Area Paste Deposits," (IBM Tech. Disclosure Bulletin) vol. 20, No. 9. Feb. 1978 pp. 3429–3430.
Sponder, "Making Printed Circuits," (IBM Tech. Disclosure Bulletin) vol. 9, No. 8, Jan. 1967 pp. 965–966.

*Primary Examiner*—John D. Smith
*Assistant Examiner*—Bernard F. Plantz
*Attorney, Agent, or Firm*—Wenderoth, Lind & Ponack

[57] ABSTRACT

A method of applying a paste through a hole in a printed circuit board. A mask is provided with a hole with an upper larger cross-section portion and a lower smaller cross-section portion, the junction between the portions forming a ring-shaped land. The lower hole portion has a cross-section larger than the cross-section of the hole in the printed circuit board. The printed circuit board is positioned adjacent the mask with the hole therein aligned with the hole in the mask, and paste is applied to the hole in the mask from the upper hole portion. This paste is pressed through the hole in the mask and fills the hole in the circuit board with paste and coats the surface of the circuit board which is toward the mask and/or the surface which is away from the mask in the area around and close to the hole with the paste.

7 Claims, 4 Drawing Figures

METHOD OF PRINTING A SPOT PATTERN IN A PRINTED CIRCUIT BOARD

This invention relates to a method of printing a spot pattern on a printed circuit board, using a paste and a mask, and more particularly to such a method for forming an electrical connection in a through-hole and/or for increasing the mechanical strength of a through-hole.

For printing a spot pattern on a printed circuit board or on an electronic component in the printed circuit board according to one prior method, a paste of, for example, an electrically conductive material or an electrically insulating material is used, and the paste is printed using a mask and a squeegee, wherein the mask has a hole having a given diameter for the paste to pass through when the paste is slidingly urged against the mask by the squeegee. However, according to such prior art, it is difficult to form a thick spot of a given spot pattern or to pass a comparatively large volume of paste through each hole.

Particularly when the method is used for filling a through-hole of a printed circuit board with a paste, it is difficult to sufficiently fill the through-hole with the paste (paste does not go through the through-hole), and to form a constant spot pattern around the inlet and outlet of the through-hole on the printed circuit board. Thus, although this prior art method might be applicable to the formation of an electrical connection in the through-hole between the inlet and outlet of the through-hole by using an electrically conductive paste, this prior art method has not been used for such purpose, namely for forming a constant feed-through electrical terminal.

Rather, conventionally, a plating of copper has been used for forming an electrical connection at the through-hole. This is based on a copper separation method using electroplating or chemical plating. By using such plating technique, a constant feed-through terminal in the through-hole can be made. However, such plating technique has drawbacks in that an expensive plating apparatus, a long plating time, and a large expense for treating waste plating liquids for preventing pollution problems are required.

As a method to overcome the problem of the firstly described method (paste does not go through a through-hole) using a paste for treating a through-hole in a printed circuit board, there has been suggested a technique in which a pin coated with a paste is inserted in a through-hole, and the pin is moved therein to transfer the paste on the pin to the through-hole wall (This method is sometimes called the pin-through method.). However, according to this prior art method, the front portion (inlet portion) on the printed circuit board and the rear portion (outlet portion) on the printed circuit board are required to be treated with a paste after the in-hole treatment. Furthermore, occasionally the through-hole is required to be subjected to suction or pressure reduction for enabling easy paste-filling, and hence requires special mechanical equipment.

Anyway, according to these prior art methods using a paste (not only the through-hole treatment), the amount of a paste supplied by one paste application is not easily controllable. Thus, in the case of coating a portion of a printed circuit board with a paste or the case of filling a through-hole of a printed circuit board, the paste-coated area on the surface of the printed circuit board is not easily controllable or constant. This is an obstacle to obtaining high stability of electrical conduction, high printing density, and high stability of mechanical strength.

It is an object of this invention to so improve a method of printing a spot pattern on a printed circuit board using a paste that the spot pattern can be formed with a large amount of paste, and the printed spot pattern can have an accurately controlled form.

Another object of this invention is to provide a method of efficiently printing a well controlled spot pattern at a through-hole in a printed circuit board, to form a mechanical and/or electrical feed-through terminal in the through-hole.

These objects are achieved according to this invention by providing a method of printing a spot pattern on a printed circuit board, comprising: preparing a paste and preparing a mask having a hole therethrough having (a) an upper large cross-section hole portion having a bottom portion and (b) a coaxial lower smaller cross-section hole portion contiguously extending downwards from the bottom portion of the upper hole portion, so that the bottom portion of the upper hole portion forms a ring-shaped land; placing a printed circuit board close to and facing the lower hole portion of the mask; applying a paste to the hole from the upper hole portion of the mask; pressing the paste applied to the hole by pressure from the upper hole portion through the lower hole portion of the mask, so as to apply a predetermined amount of the paste to a spot of the printed circuit board facing the mask; and hardening the paste to a spot pattern.

According to a further development of this invention, the spot of the printed circuit board has a through-hole having a diameter less than that of the lower hole portion of the mask and positioned substantially coaxial with the hole of the mask, whereby during the pressing step, the through-hole is filled with the paste, and the front surface and/or the rear surface of said printed circuit board around and close to the through-hole is coated with the paste.

According to this invention, a portion of paste is stored on the bottom portion of the upper hole portion of the hole of the mask (i.e. on an in-hole ring-shaped land portion) by a first paste application and pressing step. A successive paste application and pressing step, part of the newly applied paste, goes directly into the lower hole portion of the hole of the mask, but partially pushes the paste previously stored on the in-hole ring-shaped land portion through the lower hole portion. Because of the existence of the stored paste in the upper hole portion, a larger and yet more constant amount of paste can be fed through the hole in the mask than when no such upper hole portion is present even when the movement of the paste is resisted e.g. by a long or small diameter through-hole in the printed circuit board. More concretely, the movement of the stored paste and the newly applied paste is accelerated by the smaller cross-section of the lower hole portion in the mask (based on Bernoulli's theorem) during the pressing step by the squeegee. When the method of this invention is used for the purpose of filling a through-hole of a printed circuit board, which through-hole is smaller in diameter than the lower hole portion in the mask, then again according to Bernoulli's theorem, the movement of the paste is accelerated from the lower hole portion in the mask to the through-hole of the printed circuit board. But as the paste passes the through-hole, the paste gradually starts losing its speed, and at the lower end (outlet) of the through-hole, the paste completely loses its speed so as to wet-spread at the rear surface and around the peripheral edge of the through-hole of the printed circuit board.

This invention will be described in detail hereinafter with Examples, referring to drawings, wherein:

Each of FIG. 1 and FIG. 3 is a cross-sectional view of a printed circuit board, a mask, a paste and a squeegee, for describing an example of the method of this invention;

EXAMPLE 1

Figure 1:
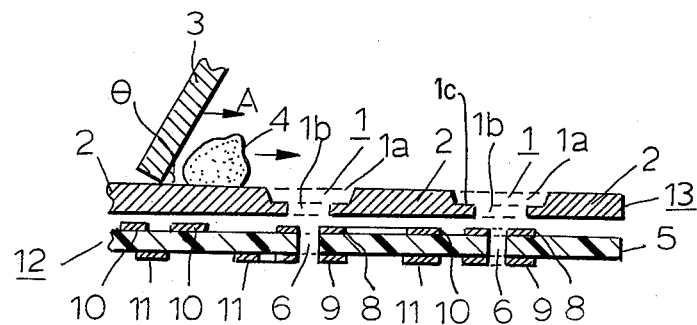

First of all, as shown in FIG. 1, a printed circuit board 12 was prepared, which had a front surface conductor layer 8 and a rear surface conductor layer 9 which were to be connected by a feed-through terminal at a through-hole 6, and which also had conductor layers 10 and 11 for forming circuit patterns. The printed circuit board substrate 5 with the conductor layers 8 and 9 was provided at the conductor layer portions with a through-hole 6 in which a feed-through terminal was to be formed.

Figure 2:
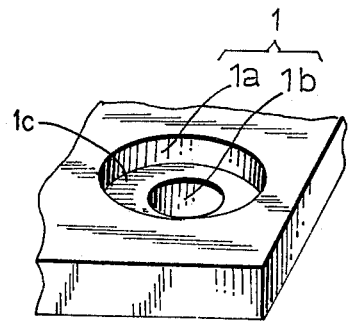
FIG. 2 is a schematic perspective view of a portion of a mask to be used in the method of the present invention.

Then as shown in FIG. 1, a printing mask 13 was placed over and very close to one surface (upper surface) of the printed circuit board 12. The mask 13 had holes 1 located at positions facing the respective through-holes in the printed circuit board. Each hole 1 was composed of an upper hole portion 1a and a lower hole portion 1b coaxial with the upper hole portion 1a. The diameter of the upper hole portion 1a was larger than the diameter of the lower hole portion 1b, thus defining a ring-shaped land 1c therebetween. The diameter of the lower hole 1b was about the same as that of the conductor layer 8, which layer 8 formed a flat ring-shaped printing land. A perspective view of the two portion hole 1 of the mask 13 is schematically shown in FIG. 2.

Figure 3:
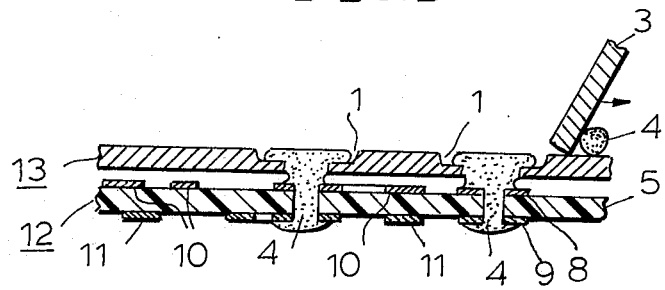

An electrically conductive paste 4 was placed on a flat surface 2 of the mask 13, and a squeegee 3 was moved in the direction A as shown in FIG. 1. The paste 4 was forced through the through-hole 6 and at the same time formed a front surface and a rear surface portion of the paste at the inlet and outlet of the through-hole 6, as shown in FIG. 3.

In this example, conductive paint 5504 of DuPont Company (silver powder-resin system) was used as the conductive paste 4. The viscosity of the paste was adjusted to $100\pm10$ poise, which is a generally used viscosity. The mask 12 can be made of plastic, wood or metal. Here, a stainless steel was used, which had a thickness of 0.2 mm. The upper and lower hole portions 1a and 1b each had a depth of 0.1 mm, and diameters of 2.5 mm and 1.5 mm, respectively. Thus the width of the in-hole ring-shaped land portion 1c was 0.5 mm.

The thickness of the printed circuit board 11 can be between 0.1 mm and 2.0 mm. Here, it was 0.8 mm. The board 11 can be made of a paper based phenolic (or epoxy) resin laminate or a porcelain on-steel board. Here, a paper based phenolic resin laminate was used, and each through-hole 6 had a diameter of 0.9 mm. The angle $\theta$ of the squeegee 3 relative to the flat surface 2 can be 50° to 90°, and the gap between the mask 13 and the board 12 can be 0.1 to 0.2 mm. Here, they were 50° and 0.2 mm, respectively. And the printing speed can be 5 to 30 cm/sec. Here, it was selected to be 10 cm/sec.

Figure 4:
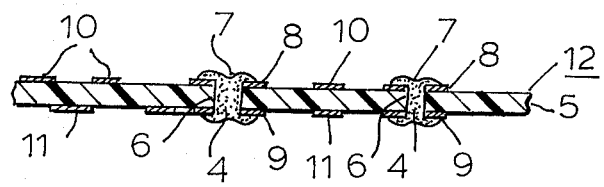
FIG. 4 is a cross-sectional view of a printed circuit board to which feed-through terminals have been applied.

By performing printing under these conditions and at room temperature, the conductive paste 4 was coated on the front surface conductor 8 (1.5 mm diameter ring-shaped land) and filled in the through-hole 6 at the same time. Simultaneously, the paste 4 in the through-hole 6 extends to rear surface conductor layer 9 due to the paste in the mask hole portion 1a and the printing pressure, so as to form a 1.5 mm diameter ring-shaped land as a rear surface conductor layer at the rear surface. Thereby, a feed-through terminal 7 was formed in the through-hole 6, as shown in FIG. 4. Then, it was heated at 155° C. for 30 minutes for hardening the paste 4.

EXAMPLE 2

A printing process the same as that in Example 1 was carried out, except that in Example 2 an electrically conductive paint 6320 of Dupont Company (silver powder-resin-glass powder system) was used as the paste; an alumina ceramic plate 0.5 mm thick was used as the printed circuit board; and a temperature of 730° C. was employed for hardening and evaporating the resin component in the conductive paste.

By the method of this invention, a ring shaped conductive land $1.8\pm0.2$ 0.2 mm in diameter can be obtained, meaning a high accuracy of the land pattern. It should be noted in this connection that in the conventional pin-through method, the accuracy of the diameter of the land is $1.8\pm1.0$ mm. Thus, it becomes possible to provide a through-hole and land terminal element even in a printed circuit board having through-holes arranged at a standardized pitch of 2.5 mm pitch. The corresponding minimum possible pitch in the conventional pin-through method is about 4.0 mm.

As to the printing speed, one printing needs 8 to 10 seconds in the conventional pin-through method, whereas it is about 2 to 4 seconds in the present invention. This invention does not need any big machine, and the amount of the paste consumed can be reduced to a minimum.

Although the above examples are for cases where this invention is used for the constant and highly reproducible formation of a feed-through electrical terminal in a through-hole of a printed circuit board, this invention can be used for other purposes. For example, when the mask hole 1 is placed over a flat surface of the printed circuit board, a constant thick paste coating can be applied thereto by the method of this invention due to the smaller lower hole portion 1b and the upper large hole portion 1a which acts to store the paste. Likewise, when the mask hole is placed over an electronic component and an insulating resin paste is used, a constant thick resin coating can be made by a simple printing method according to this invention. Of course, in the case of the above example also, if the through-hole 6 already has a feed-through electrical terminal in the through-hole e.g. a plated hole, then an insulating paste can be used to fill such a through-hole for merely mechanically strengthening the through-hole. In such case also, the advantage of this invention, i.e. constant, reproducible application of a large of paste, can be obtained.

The mask used in this invention has a long life, and it is easy to wash remaining paste from the mask. Examples of materials for the mask 13 are metal, wood, resin, rubber or laminate e.g. of a paper and a plastic film. An accurately shaped mask hole can be made by etching a stainless steel plate from both sides thereof using a photo-resist etching method. Alternatively, the mask can be made by bonding two mask segments, one segment having a thickness corresponding to the depth of the upper hole portion 1a and having only the upper hole portion 1a therein, the other segment likewise having only the lower hole portion 1b coaxially aligned with the upper hole 1a. The wall of the hole portions in the mask usually are straight vertical walls. However, they can have a gradient which is produced by using a known etching technique. However, such gradient is not recommended, because the paste is likely to spread at the lower outer surface of the mask hole during the rest time in the printing process.

Examples of the materials for the printed circuit board are a paper-based phenolic resin laminate, a paper-based epoxy resin laminate, a glass-cloth based epoxy resin laminate, a glass-mat epoxy impregnated laminate, a glass-mat unsaturated polyester impregnated laminate, and a composite plate of a glass-cloth or a glass-paper with resin impregnated therein. The thickness of the printed circuit board is preferably not thicker than a standard thickness. Alternative examples of an insulating substrate material for the printed circuit board are glass, alumina ceramic, fosterite ceramics, and mullite ceramic. Of course, plastic film plates are also usable as the printed circuit board, such as polyimide, polyester, polyimide-amide, and polysulfon. Further, a rubber plate is also usable, such as silicone rubber, polybutadiene rubber, and acryl-nitrile rubber. Still other examples of the material for the board are a resin coated metal plate or film such as iron, aluminum, copper and mickel.

An example of a conductive paste or paint is a blend of a metal powder and a resin powder binder or glass powder binder dispersed in a solvent. Examples of such a metal powder are noble metals such as gold, silver and platinum. Alternatively, there can be used a base metal such as copper, aluminum, zinc, tin, molybdenum, silicon and tungsten, an inorganic powder such as carbon, or a composite powder such as one composed of powder particles each of which is a silver coated carbon.

The adhesion strength of the insulating paste or conductive paste with respect to the printed circuit board is increased by the hardening of the resin blended in the paste upon heating or irradiation by application of ultraviolet light, an electron beam or X-rays. If a glass is blended in place of a resin, the paste should usually be heated to a temperature of at least 350° C. So in such case, the printed circuit board should be refractory or heat-resistive. Examples of materials of such board are a polyimide film, a glass-cloth based epoxy resin laminate with a triazine resin blended in it, an alumina ceramic, a forsterite ceramic, and a mullite ceramic. Alternatively, a metal plate or a porcelain-enamel on-steel board (porcelain-enamel being provided as an insulating film) can be used.

The conductive paste or paint preferably comprises 55 to 65 weight percent of a conductive powder, 20 to 5 weight percent of resin or glass powder, and the remainder solvent. Of course, in order to increase or adjust the conductivity of the paste, plural kinds of conductor powders, resins and solvents can be used. The solvent in the paste is preferably evaporated as much as possible before the heating or hardening step, in order to reduce the generation of voids in the resultant spot pattern. Examples of the solvent are butylacetate and carbitol acetate. However, alternatively, a gel-form resin of the non-solvent type can also be used.

According to this invention, an accurate thick film coating or an accurate feed-through terminal can be formed on or in a printed circuit board by one time printing and hardening, which makes possible an efficient production thereof. As described above, his invention is applicable not only to the production of an electrical feed-through terminal as exemplified above, but also to (a) the production of a mechanical feed-through terminal for enhancing the strength of a through-hole already having an electrical connection, and (b) the production of a coating (e.g. 0.015 to 0.2 mm thick) on a component or a board such as a coating on a concave portion such as a window-through connection or as a mechanical enhancer.

What is claimed is:

1. A method of applying a paste through a through-hole in a printed circuit board, comprising:
   forming a mask having a hole therethrough having (a) an upper larger cross-section hole portion having a bottom portion and (b) a lower smaller cross-section hole portion extending downwards from said bottom portion of said upper hole portion and said bottom portion of said upper hole portion forming an inhole ring-shaped land, the lower hole portion having a cross-section larger than the cross-section of said through hole in the printed circuit board;
   placing the printed circuit board close to and facing said lower hole portion of said mask with said through hole positioned substantially coaxially with said hole in said mask and with the portion of the surface of said printed circuit board which is away from said mask uncovered;
   applying a paste to said hole in said mask from said upper hole portion;
   pressing said paste applied to said upper hole portion through said lower hole portion of said mask and through said through-hole in said printed circuit board for filling said through-hole with said paste and coating the surface of the printed circuit board which is toward said mask and/or the surface of said printed circuit board which is away from said mask in the area around and close to said through-hole with said paste; and hardening said paste.

2. A method according to claim 1, wherein said paste is an electrically conductive paste, and said surfaces of said printed circuit board have an electrically conductive land thereon sufficiently close to said through-hole to be contacted by said paste during said pressing step, whereby an electrical feed-through terminal is formed in said through-hole.

3. A method according to claim 1, wherein said pressing step is carried out by sliding a squeegee along said mask.

4. A method according to claim 1, wherein said hole in said mask is made by forming a hole in a plate.

5. A method according to claim 1, wherein said mask is formed by placing an upper plate having a hole therein constituting said upper hole portion on a lower plate having a further hole therein constituting said lower hole portion with said holes in said plate being coaxial with each other.

6. A method according to claim 1, wherein said paste is an electrically conductive paste.

7. A method according to claim 1, wherein said paste is in an electrically insulating resin.

* * * * *